United States Patent
Lin et al.

(10) Patent No.: US 7,262,109 B2
(45) Date of Patent: Aug. 28, 2007

(54) INTEGRATED CIRCUIT HAVING A TRANSISTOR LEVEL TOP SIDE WAFER CONTACT AND A METHOD OF MANUFACTURE THEREFOR

(75) Inventors: John Lin, Chelmsford, MA (US); Tony T. Phan, Flower Mound, TX (US); Philip L. Hower, Concord, MA (US); William C. Loftin, Plano, TX (US); Martin B. Mollat, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 5 days.

(21) Appl. No.: 11/196,087

(22) Filed: Aug. 3, 2005

(65) Prior Publication Data

US 2007/0045732 A1 Mar. 1, 2007

(51) Int. Cl.
*H01L 21/76* (2006.01)
(52) U.S. Cl. ...................... 438/405; 438/412
(58) Field of Classification Search ............... 438/151, 438/164, 404, 405, 412, 424, 430
See application file for complete search history.

(56) References Cited

U.S. PATENT DOCUMENTS

| 5,569,621 | A | * | 10/1996 | Yallup et al. ............... 438/404 |
|---|---|---|---|---|
| 6,130,458 | A | * | 10/2000 | Takagi et al. ............... 257/351 |
| 6,303,414 | B1 | * | 10/2001 | Ang et al. .................... 438/155 |
| 6,492,244 | B1 | * | 12/2002 | Christensen et al. ........ 438/404 |
| 7,074,713 | B2 | * | 7/2006 | Chen et al. ................. 438/637 |
| 2003/0203546 | A1 | * | 10/2003 | Burbach et al. ............ 438/151 |
| 2006/0105508 | A1 | * | 5/2006 | Zia et al. ..................... 438/152 |

* cited by examiner

*Primary Examiner*—Tuan H. Nguyen
(74) *Attorney, Agent, or Firm*—Jacqueline J. Garner; W. James Brady, III; Frederick J. Telecky, Jr.

(57) ABSTRACT

The present invention provides an integrated circuit and a method of manufacture therefor. The integrated circuit (100), in one embodiment without limitation, includes a dielectric layer (120) located over a wafer substrate (110), and a semiconductor substrate (130) located over the dielectric layer (120), the semiconductor substrate (130) having one or more transistor devices (160) located therein or thereon. The integrated circuit (100) may further include an interconnect (180) extending entirely through the semiconductor substrate (130) and the dielectric layer (120), thereby electrically contacting the wafer substrate (110), and one or more isolation structures (150) extending entirely through the semiconductor substrate (130) to the dielectric layer (120).

15 Claims, 6 Drawing Sheets

INTEGRATED CIRCUIT HAVING A TRANSISTOR LEVEL TOP SIDE WAFER CONTACT AND A METHOD OF MANUFACTURE THEREFOR

TECHNICAL FIELD OF THE INVENTION

The present invention is directed, in general, to a wafer contact and, more specifically, to an integrated circuit having a transistor level top side wafer contact and a method of manufacture therefore.

BACKGROUND OF THE INVENTION

Silicon-on-insulator (SOI) technology is becoming of increasing importance in the field of integrated circuits. SOI technology deals with the formation of transistors in a layer of semiconductor material that overlies an insulating layer. A common embodiment of SOI structures is a single crystal layer of silicon that overlies a layer of silicon dioxide.

High performance and high-density integrated circuits are generally achievable using SOI technology because of the reduction of parasitic elements present in integrated circuits formed in bulk semiconductor. For example, for a MOS transistor formed in bulk, parasitic capacitance is present at the junction between the source/drain regions and the underlying substrate, and the possibility of breakdown of the junction between source/drain regions and the substrate regions also exists. A further example of parasitic elements is present for CMOS technology in bulk, where parasitic bipolar transistors formed by n-channel and p-channel transistors in adjacent wells can give rise to latch-up problems. Since SOI structures significantly alleviate parasitic elements, and increase the junction breakdown tolerance of the structure, the SOI technology is well suited for high performance (e.g., analog devices) and high-density integrated circuits.

However, the underlying insulator film in an SOI structure presents certain problems relative to the transistor performance. For instance, noise and coupling capacitance associated with the SOI structure tends to degrade the transistor performance. In an attempt to reduce or alleviate the aforementioned noise and coupling capacitance issues, the industry uses a backside wafer contact. Unfortunately, the backside wafer contact currently employed uses costly lead frames and/or down bonding techniques that are typically relegated to the transistor die perimeter.

Accordingly, what is needed is a backside contact and method for manufacture therefore that does not experience the drawbacks of the conventional backside contacts.

SUMMARY OF THE INVENTION

To address the above-discussed deficiencies of the prior art, the present invention provides an integrated circuit and a method of manufacture therefor. The integrated circuit, in one embodiment without limitation, includes a dielectric layer located over a wafer substrate, and a semiconductor substrate located over the dielectric layer, the semiconductor substrate having one or more transistor devices located therein or thereon. The integrated circuit may further include an interconnect extending entirely through the semiconductor substrate and the dielectric layer, thereby electrically contacting the wafer substrate, and one or more isolation structures extending entirely through the semiconductor substrate to the dielectric layer.

As briefly mentioned above, the present invention is also directed to a method for manufacturing an integrated circuit. In addition to certain other steps, the method for manufacturing the integrated circuit may include providing a stack of layers including a wafer substrate, a dielectric layer located over the wafer substrate, and a semiconductor substrate located over the dielectric layer, the semiconductor substrate having one or more transistor devices located therein or thereon, forming an interconnect that extends entirely through the semiconductor substrate and the dielectric layer, thereby electrically contacting the wafer substrate, and forming one or more isolation structures that extend entirely through the semiconductor substrate to the dielectric layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
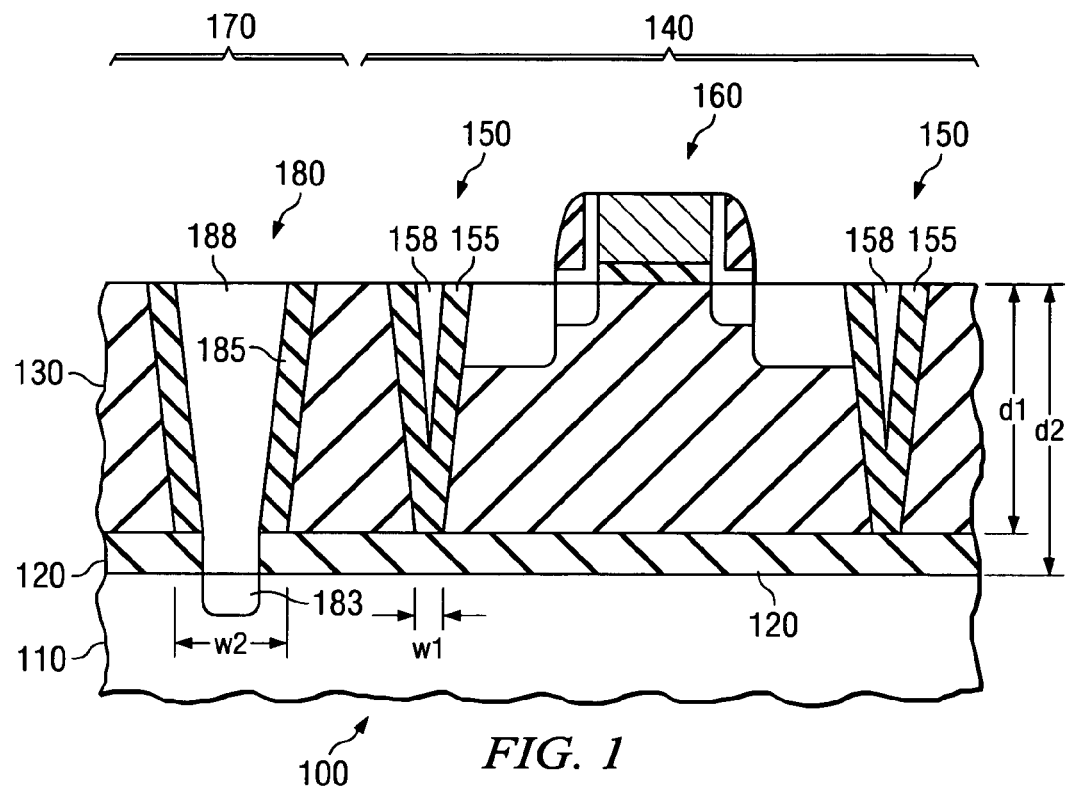
FIG. 1 illustrates a cross-sectional view of an integrated circuit that has been manufactured in accordance with the principles of the present invention.

Referring initially to FIG. 1, illustrated is a cross-sectional view of an integrated circuit 100 that has been manufactured in accordance with the principles of the present invention. The integrated circuit 100 illustrated in FIG. 1 initially includes a dielectric layer 120, such as a buried oxide layer (e.g., silicon dioxide), located over a wafer substrate 110. Conventionally located over the dielectric layer 120 is a semiconductor substrate 130. The semiconductor substrate 130, among other materials, may comprise single crystal silicon.

The collection of the wafer substrate 110, dielectric layer 120, and the semiconductor substrate 130 is often referred to as a silicon-on-insulator (SOI) structure. It should be apparent, however, that even though the SOI structure of FIG. 1 is illustrated and described as having certain features, the invention to be disclosed herein is applicable to all forms of SOI including stacked as well as single layer structures. Hence, this invention applies to transistor devices built on all forms of SOI including, for example, heteroepitaxy, such as SOS, beam recrystallization, epitaxial lateral overgrowth, lateral solid phase epitaxy, and single silicon separation (e.g. SIMOX and FIPOS).

The integrated circuit 100 illustrated in FIG. 1, and more particularly the wafer substrate 110, dielectric layer 120 and the semiconductor substrate 130, include multiple device regions. For example, the integrated circuit 100 includes an active device region 140, as well as wafer substrate contact region 170. While each of the regions is illustrated in FIG. 1 as comprising somewhat similar wafer substrate real estate, such is generally not the case. In many situations, hundreds, thousands, or even millions of active devices will be located in the active device region 140 for each device located within the wafer substrate contact region 170.

The active device region 140 illustrated in FIG. 1 includes one or more isolation structures 150 located proximate, and in this instance flanking both sides of, a transistor device 160. Each of the isolation structures 150, at least in the embodiment of FIG. 1, include a sidewall spacer 155 located within an isolation structure trench, and a plug 158 filling any portion of the isolation structure trench not filled by the sidewall spacer 155. In one exemplary embodiment of the present invention, the sidewall spacer 155 has an oxide liner and a polysilicon sidewall and the plug 158 is a polysilicon plug. As the polysilicon sidewall spacer and the polysilicon plug are often formed in different manufacturing steps and manufacturing processes, an interface will often result between the two. Nevertheless, certain embodiments may exist wherein the integrated circuit 100 is subjected to certain processes that might cause the interface to disappear.

The isolation structures 150, which may be deep trench isolation structures, should extend entirely through the semiconductor substrate 130. In the embodiment shown, the isolation structures 150 stop on the dielectric layer 120. The isolation structures 150 should have a depth ($d_1$) into the integrated circuit 100, most likely based upon the thickness of the semiconductor substrate 130. Similarly, the isolation structures 150 should have a base width ($w_1$). In certain embodiments of the present invention, the base width ($w_1$) should be at least less than half as wide as the base width ($w_2$) of the interconnect 180. To say it another way, the base width ($w_2$) of the interconnect 180 should be at least about two times the base width ($w_1$) of the isolation structures 150.

The transistor device 160, as is common, includes a gate electrode located over a gate dielectric. The transistor device 160 further includes source/drain regions, including source/drain extension implants. While not illustrated, the transistor device 160 may comprise many other features and elements while staying within the scope of the present invention.

While only a single transistor device 160 is illustrated in FIG. 1, those skilled in the art appreciate that it is common for many transistor devices 160 to be located on or in the semiconductor substrate 130, each being isolated from each other using the isolation structures 150.

The substrate contact region 170 of the integrated circuit 100 includes the previously mentioned interconnect 180. In accordance with the principles of the present invention, the interconnect 180 extends entirely through the semiconductor substrate 130, and the dielectric layer 120, thereby contacting the wafer substrate 110. In the illustrative embodiment of FIG. 1, the interconnect 180 includes a doped ohmic contact 183 located within the wafer substrate 110, sidewall spacers 185 located along the sidewalls of the trench that forms the interconnect 180, and a plug 188 located within and filling any unfilled portion of the trench that forms the interconnect 180.

In an advantageous embodiment of the present invention, the sidewall spacers 185 do not entirely cover a base of the trench that forms the interconnect 180. In an exemplary embodiment, the base of the trench that forms the interconnect 180 is substantially void of the sidewall spacers 185. As will be understood further below, this feature has certain manufacturing advantages. The sidewall spacers 185, among other materials, may comprise polysilicon, similar to the isolation structures 150. Similarly, but without limitation, the plug 188 may comprise polysilicon. As the sidewall spacers 185 and the sidewall spacers 155, as well as the plug 188 and the plug 158, respectively, are formed at substantially the same time, they tend to comprise similar materials.

As briefly mentioned above, the interconnect 180 should also have a depth ($d_2$) into the integrated circuit 100, most likely based upon the thickness of the semiconductor substrate 130, the dielectric layer 120, and possibly a portion of the wafer substrate 110. Similarly, the interconnect 180 should have a base width ($w_2$). In certain embodiments of the present invention, the base width ($w_2$) of the interconnect 180 should be at least about two times the base width ($w_1$) of the isolation structures 150. This unique feature adds to the ease of manufacturing of the integrated circuit 100, and more particularly the isolation structures 150 and interconnect 180, as will be understood more fully below.

The integrated circuit 100 illustrated in FIG. 1 having the interconnect 180 experiences many benefits over conventional structures. For instance, the interconnect 180 contacting the wafer substrate 110 is not relegated to the edge of the wafer, as conventional lead frame structures were. Accordingly, the interconnect 180 may be positioned at any desired location in the integrated circuit 100. Furthermore, the manufacture of the interconnect 180 may be easily added to conventional process flows, and more particularly to the process flow for forming the isolation structures, thus it is less time consuming and expensive, all the while providing the ability to bias the wafer substrate 110 to decrease noise and coupling capacitance.

Figure 2:
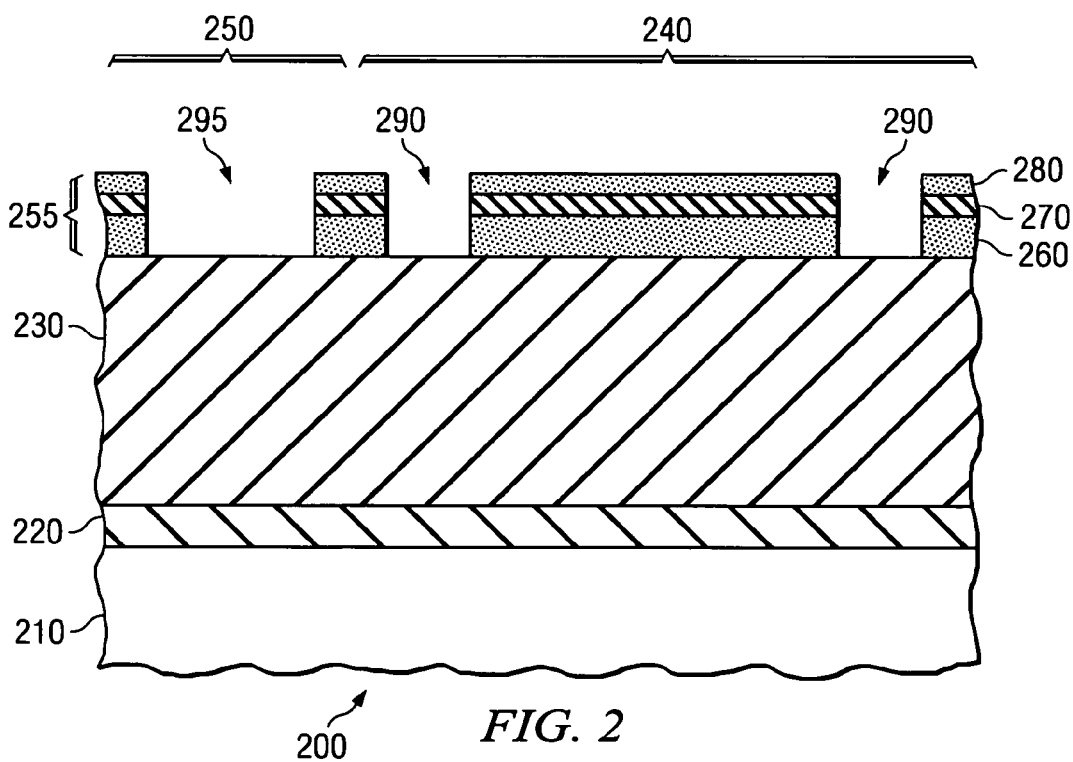
FIG. 2 illustrates a cross-sectional view of a partially completed integrated circuit.

Turning now to FIGS. 2-10, illustrated are cross-sectional views of detailed manufacturing steps instructing how one might, in an advantageous embodiment, manufacture an integrated circuit similar to the integrated circuit 100 depicted in FIG. 1. FIG. 2 illustrates a cross-sectional view of a partially completed integrated circuit 200. The partially completed integrated circuit 200 of FIG. 2 includes a wafer substrate 210. The wafer substrate 210 may comprise a variety of different substrates while staying within the scope of the present invention. Nevertheless, in the current example, the wafer substrate 210 is a conventional p-type or n-type doped substrate that was obtained from a standard silicon ingot. While the thickness of the wafer substrate 210 is generally unimportant to the inventive aspects of the present invention, certain embodiments exist wherein the thickness of the wafer substrate 210 ranges from about 200 μm to about 1000 μm.

Located over the wafer substrate 210 in the embodiment of FIG. 2 is a dielectric layer 220. The dielectric layer 220, similar to the wafer substrate 210, may comprise a variety of different materials while staying within the scope of the present invention. In the embodiment of FIGS. 2-10, however, the dielectric layer 220 comprises a buried oxide layer, such as a buried silicon dioxide layer.

Those skilled in the art understand the process for manufacturing the dielectric layer 220. In one embodiment the dielectric layer 220 is formed by depositing or growing the dielectric layer 220 to a thickness ranging from about 100 nm to about 1000 nm. In another embodiment, however, the thickness of the dielectric layer 220 might range from about 150 nm to about 500 nm. Nonetheless, the present invention should not be limited to the aforementioned materials or thicknesses.

Located over the dielectric layer 220 in the embodiment of FIGS. 2-10 is a semiconductor substrate 230. The semiconductor substrate 230 happens to be single crystal silicon, but other well-known or hereafter discovered materials may also be used. Accordingly, the present invention should not be limited to any specific material for the semiconductor substrate 230.

Similar to many of the other layers within the partially completed integrated circuit 200, the thickness of the semiconductor substrate 230 is generally unimportant to the inventive aspects of the present invention. Nevertheless, the semiconductor substrate 230 illustrated in FIGS. 2-10 may have a thickness ranging from about 1 μm to about 20 μm, with a preferred range between about 3 μm and about 10 μm. These ranges, while not governed by the inventive aspects of the present invention, are generally governed by other design criteria of the integrated circuit 200.

Optionally located in a lower portion of the semiconductor substrate 230 may be a device under field (DUF) structure (not shown). The DUF structure basically consists of a heavily doped region in the semiconductor substrate 230, for example heavily doped with boron or antimony. As those skilled in the art are aware, the DUF is configured to reduce collector resistance.

The integrated circuit 200 illustrated in FIG. 2, and more particularly the wafer substrate 210, dielectric layer 220 and the semiconductor substrate 230 include multiple device regions. For example, the integrated circuit 200 includes an active device region 240, as well as wafer substrate contact region 250.

Located over the semiconductor substrate 230 in both of the active device region 240 and the wafer substrate contact region 250 is a hard mask 255 that is configured to help define subsequent trenches in the semiconductor substrate 230. In the embodiment of FIG. 2, the hard mask 255 comprises a stack of layers. Nevertheless, the present invention is not limited to such a structure.

Each of the different layers comprising the hard mask 255 may consist of many different materials and have many different thicknesses while staying within the scope of the present invention. In the given embodiment of FIG. 1, the hard mask 255 includes a first tetraethyl orthosiliciate (TEOS) layer 260, a nitride layer 270 and a second TEOS layer 280. In this embodiment, the first TEOS layer 260 might have a thickness ranging from about 500 nm to about 2000 nm, the nitride layer 270 might have a thickness ranging from about 100 nm to about 300 nm, and the second TEOS layer 280 might have a thickness ranging from about 100 nm to about 400 nm. Nevertheless, the present invention should not be limited to specific manufacturing processes or thicknesses.

As is illustrated, the hard mask 255 has been conventionally patterned, resulting in openings 290, 295, therein. The openings 290 in the hard mask 255 are located in the active device region 240, while the opening 295 in the hard mask 255 is located in the substrate contact region 250. The widths of each of the openings 290, 295, as will be understood further below, may be quite important to certain aspects of the present invention.

Figure 3:
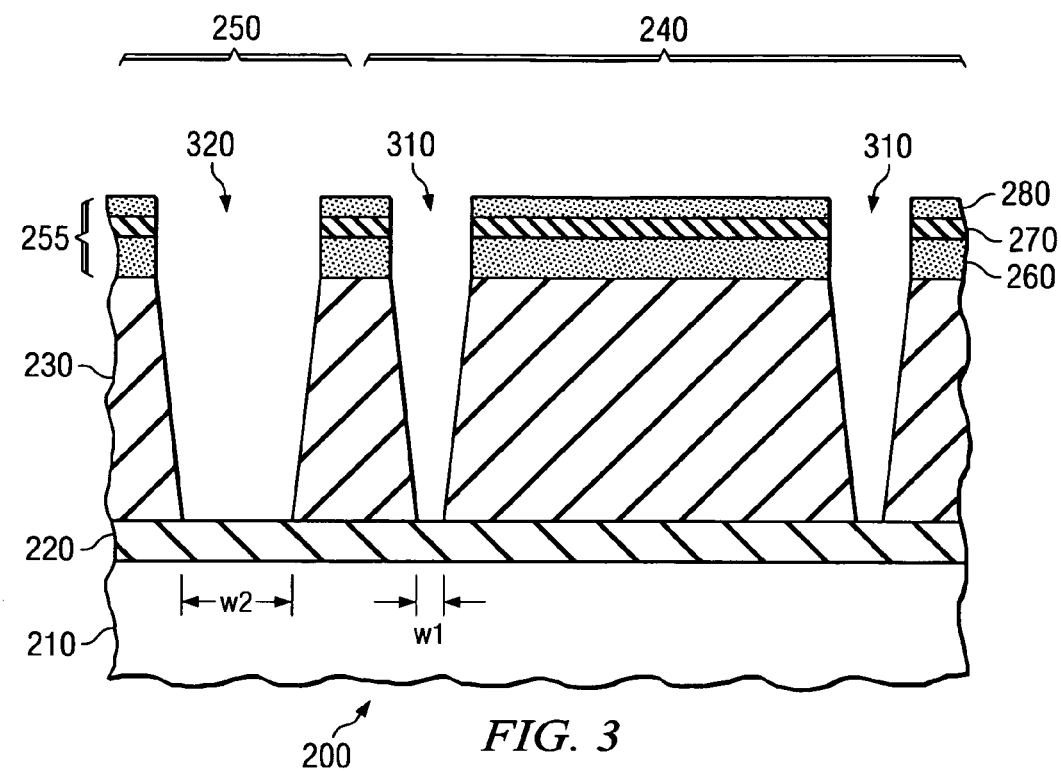
FIG. 3 illustrates a cross-sectional view of the partially completed integrated circuit illustrated in FIG. 2 after etching the semiconductor substrate using the hard mask, resulting in isolation structure trenches and an interconnect trench.

Turning now to FIG. 3, illustrated is a cross-sectional view of the partially completed integrated circuit 200 illustrated in FIG. 2 after etching the semiconductor substrate 230 using the hard mask 255, resulting in isolation structure trenches 310 and an interconnect trench 320. The etchant used in FIG. 3 is chosen based upon its ability to easily and accurately etch the material of the layer it is etching. In this embodiment, the etchant is chosen based upon its ability to etch the semiconductor substrate 230, which happens to be silicon, and more specifically single crystal silicon. In an exemplary embodiment, this etch is chosen to be selective to the semiconductor substrate 230 and not the dielectric layer 220, thus allowing the etch to stop on the dielectric layer 220. Nevertheless, those skilled in the art understand the various other etch chemistries that could be used to etch the semiconductor substrate 230.

Because of the aforementioned etch selectivity, the trenches 310, 320, stop on the dielectric layer 220, as shown. In accordance with one embodiment of the present invention, the resulting interconnect trench 320 may have a base width ($w_2$) that is at least about two times a base width ($w_1$) of the isolation trenches 310. For instance, the base width ($w_2$) of the interconnect trench 320 might range from about 2 μm to about 5 μm, while the base width ($w_1$) of each of the isolation trenches might range from about 1 μm to about 2 μm. Nevertheless, other embodiments exist wherein the widths of the interconnect trench 320 and the isolation trenches 310 are outside of the aforementioned ranges.

Figure 4:
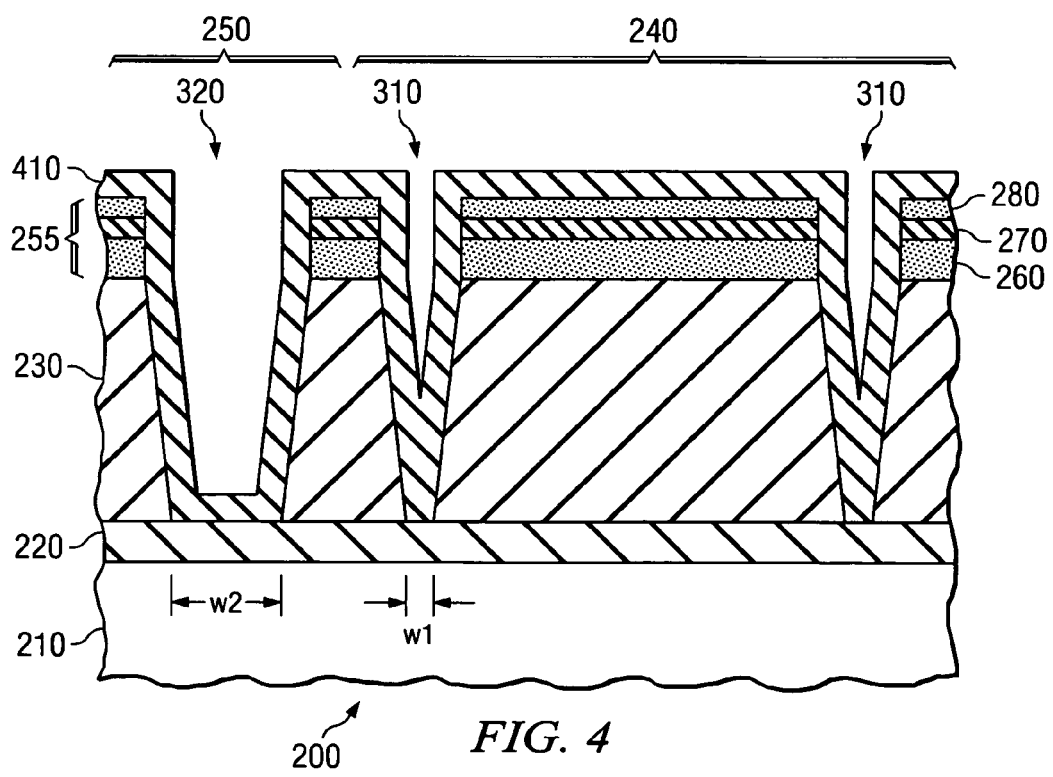
FIG. 4 illustrates a cross-sectional view of the partially completed integrated circuit illustrated in FIG. 3 after forming a layer of spacer material within the isolation trenches and the interconnect trench.

Turning now to FIG. 4, illustrated is a cross-sectional view of the partially completed integrated circuit 200 illustrated in FIG. 3 after forming a layer of spacer material 410 within the isolation trenches 310 and the interconnect trench 320. In one exemplary embodiment of the present invention, the layer of spacer material is a layer of polysilicon material. However, other embodiments may exist wherein other materials are used for the layer of spacer material 410.

The layer of spacer material 410 may be conventionally formed and should have a thickness such that it is laminar at the bottom of the interconnect trench 320, but puddles at the base of the isolation trenches 310, as shown. If the thickness of the layer of spacer material 410 is too thin, then the layer of spacer material might be laminar at the base of both the interconnect trench 320 and the isolation trenches 310. On the other hand, if the thickness of the layer of spacer material 410 is too thick, then the layer of spacer material might puddle at the base of both the interconnect trench 320 and the isolation trenches 310. Obviously, the base width ($w_2$) of the interconnect trench 320 and the base width ($w_1$) of the isolation trenches 310 have an impact also. Nevertheless, it has been observed that a thickness for the layer of spacer material 410 ranging from about 500 nm to about 1000 nm, works well for the widths discussed above.

Figure 5:
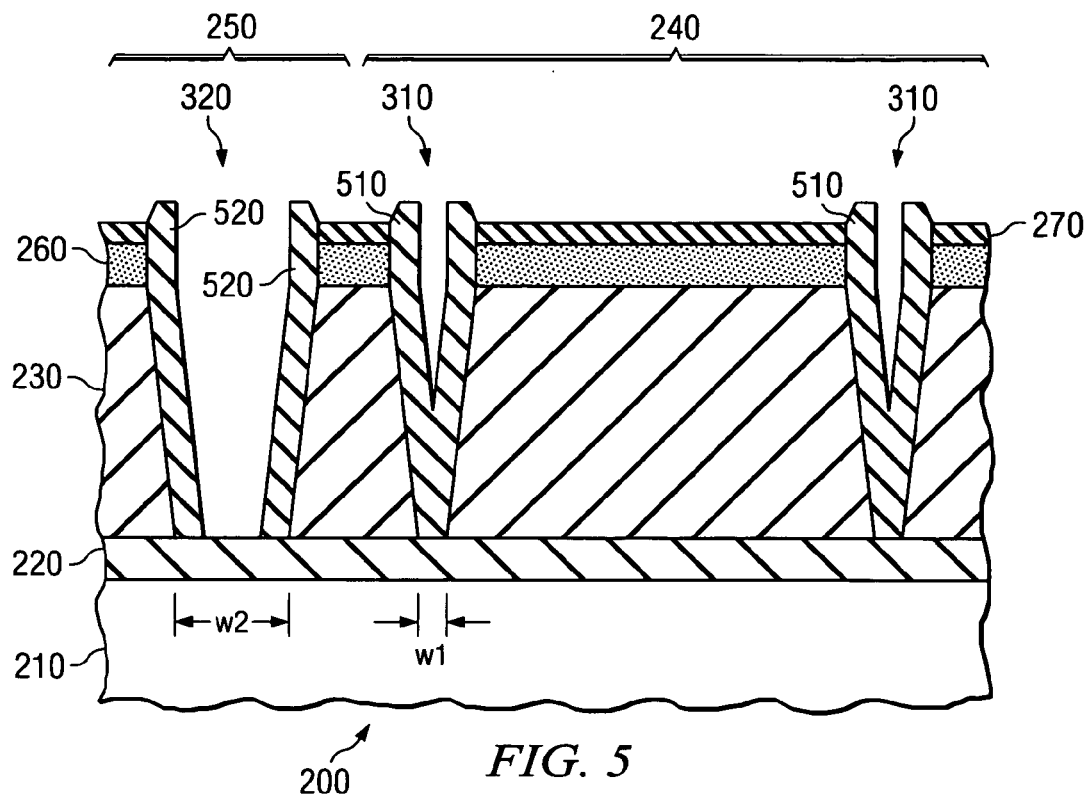
FIG. 5 illustrates a cross-sectional view of the partially completed integrated circuit illustrated in FIG. 4 after subjecting the layer of spacer material to an etch, resulting in sidewall spacers in the isolation trenches and in the interconnect trench.

Turning now to FIG. 5, illustrated is a cross-sectional view of the partially completed integrated circuit 200 illustrated in FIG. 4 after subjecting the layer of spacer material 410 to an etch, resulting in sidewall spacers 510 in the isolation trenches 310 and sidewall spacers 520 in the interconnect trench 320. In an exemplary embodiment of the present invention, the etch is a conventional anisotropic etch designed to etch the layer of spacer material 410 located on horizontal surfaces. When using the anisotropic etch, and particularly in view of the laminar nature of the layer of spacer material 410 in the bottom of the interconnect trench 320 and the puddled nature of the layer of spacer material 410 in the bottom of the isolation trenches 310, the bottom of the interconnect trench 320 has the layer of spacer material 410 substantially removed therefrom. Accordingly, the dielectric layer 220 is exposed at the bottom of the interconnect trench 320. Because the layer of spacer material 410 that was initially located in the bottom of the isolation trenches 310 had puddled, and was therefore thicker, the layer of spacer material 410 remains at the bottom of the isolation trenches 310, and thus still protects the dielectric layer 220 thereunder.

Those skilled in the art understand the conventional anisotropic etch discussed above. For example, in the embodiment wherein the layer of spacer material 410 is polysilicon, the anisotropic etch could be a tetrafluoromethane-based reactive ion etch. Nevertheless, other embodiments might exist wherein the layer of spacer material 410 were another material, and thus another etch might be used.

Figure 6:
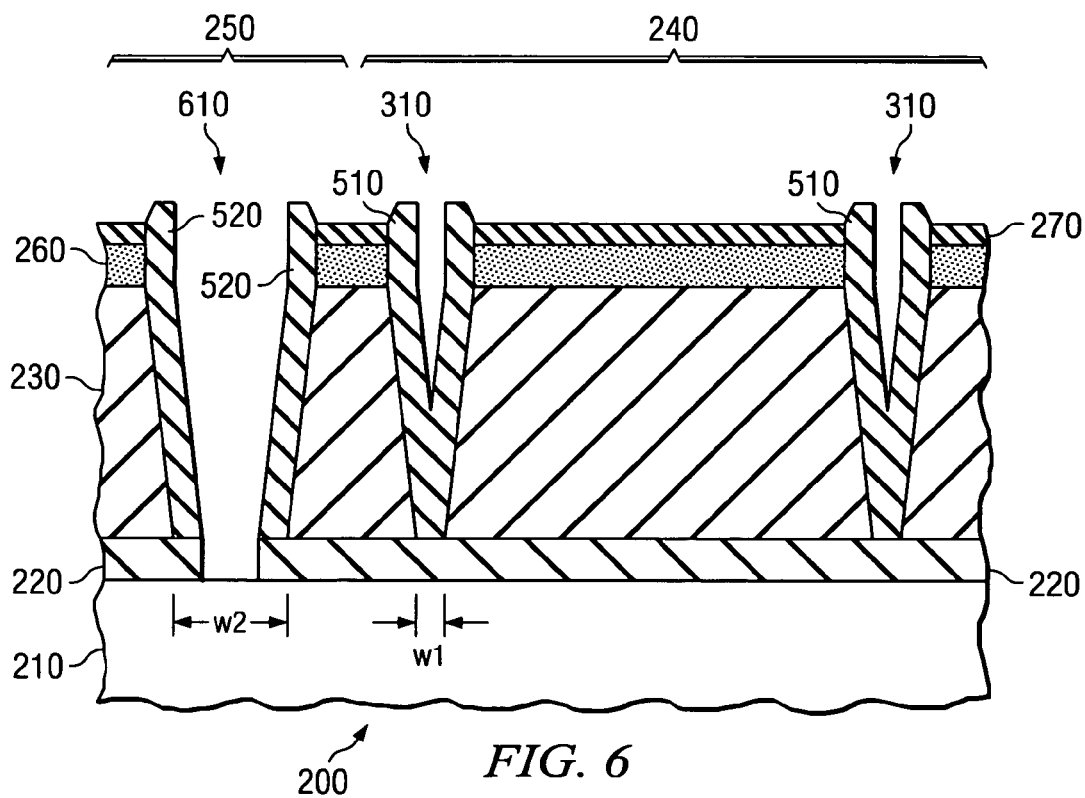
FIG. 6 illustrates a cross-sectional view of the partially completed integrated circuit illustrated in FIG. 5 after etching through the exposed portion of the dielectric layer at the bottom of the interconnect trench.

Turning now to FIG. 6, illustrated is a cross-sectional view of the partially completed integrated circuit 200 illustrated in FIG. 5 after etching through the exposed portion of the dielectric layer 220 at the bottom of the interconnect trench 320. What results after this etch step is an interconnect trench 610 that extends entirely through the semiconductor substrate 230 and the dielectric layer 220, and terminates on or in the wafer substrate 210. Those skilled in the art understand the conventional etch that might be used to remove the exposed portion of the dielectric layer 220. For example, a highly selective oxide etch, such as a trifluoromethane-based reactive ion etch, could be used if the dielectric layer 220 comprised a buried oxide layer (e.g., silicon dioxide). As the sidewall spacers 510 remain at the bottom of the isolation trenches 310, and thus protect the dielectric layer 220 located thereunder, the aforementioned etch does not substantially effect the isolation trenches 310.

Figure 7:
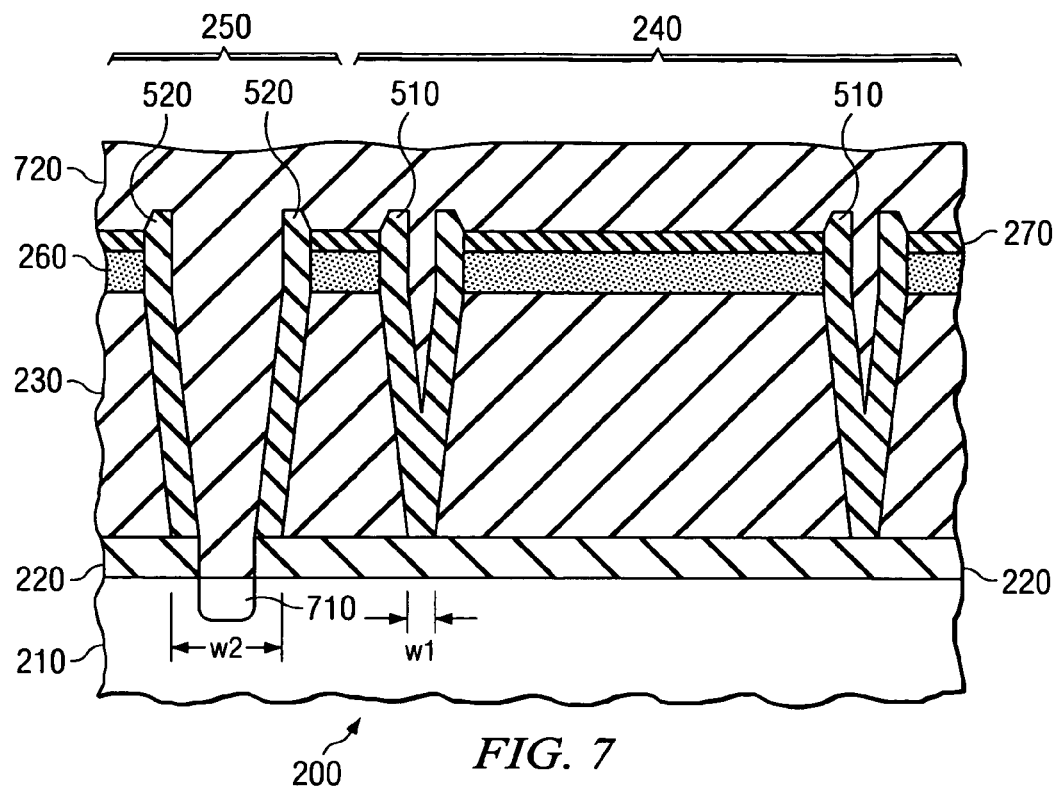
FIG. 7 illustrates a cross-sectional view of the partially completed integrated circuit illustrated in FIG. 6 after forming an ohmic contact at the bottom of the interconnect trench, and forming a plug material within the isolation trenches and the interconnect trench.

Turning now to FIG. 7, illustrated is a cross-sectional view of the partially completed integrated circuit 200 illustrated in FIG. 6 after forming an ohmic contact 710 at the bottom of the interconnect trench 610, and forming a plug material 720 within the isolation trenches 310 and the interconnect trench 610. The ohmic contact 710, in the embodiment of FIG. 7, is a doped ohmic contact that was formed in the wafer substrate 210 by subjecting the entire integrated circuit 200 to a dopant. For example, the entire integrated circuit 200 at this stage of manufacture may have been subjected to a blanket phosphorous implant, thereby forming the doped ohmic contact 710. Advantageous to the present invention, the previously patterned hard mask 255, or at least a remaining portion thereof, protects all but the isolation trenches 310 and the interconnect trench 610 from the dopant. Accordingly, no new mask steps are required to form the doped ohmic contact. Other embodiments may exist wherein a conductive material is formed in the bottom of the interconnect trench 610. Accordingly, the present invention should not be limited to any specific material or process.

After forming the ohmic contact 710, a blanket layer of plug material 720 may be formed within the isolation trenches 310 and the interconnect trench 610. In the given embodiment of FIG. 7, the blanket layer of plug material 720 is a blanket layer of polysilicon. The blanket layer of polysilicon should be deposited to such a thickness as to completely fill the isolation trenches 310 and the interconnect trench 610. Other materials, however, may also be used. Those skilled in the art understand the conventional process for filling the isolation trenches 310 and the interconnect trench 610 with the plug material 720, thus no further detail is required.

Figure 8:
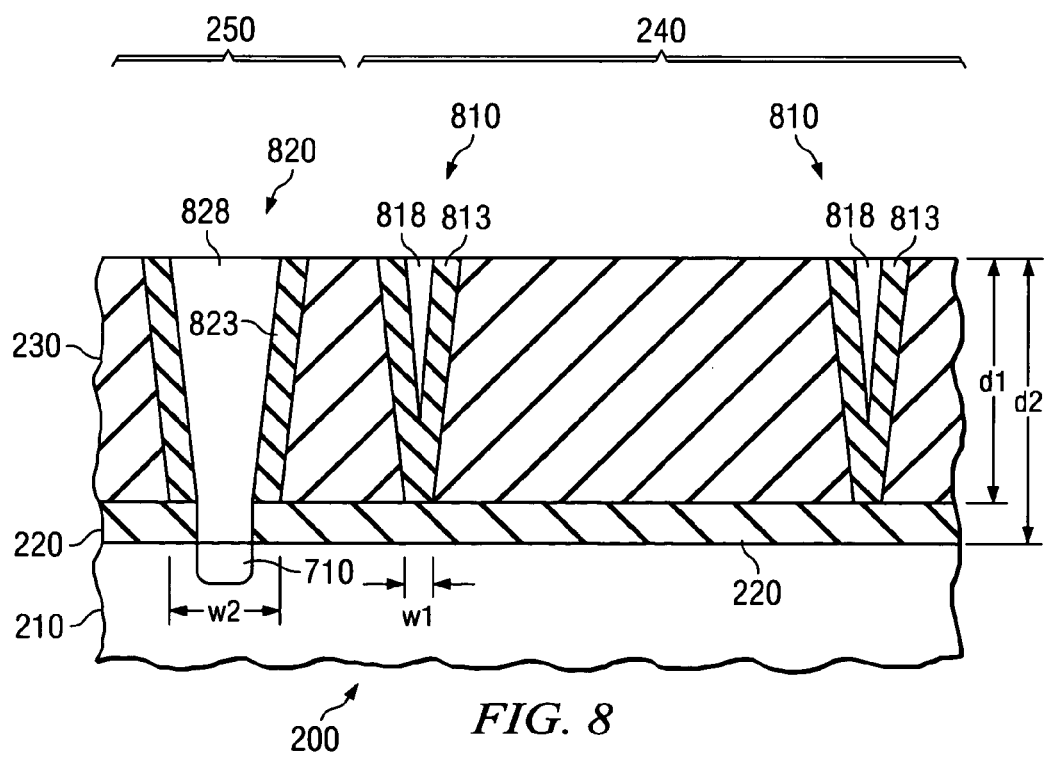
FIG. 8 illustrates a cross-sectional view of the partially completed integrated circuit illustrated in FIG. 7 after planarizing the blanket layer of plug material, thereby forming completed isolation structures and an interconnect structure.

Turning now to FIG. 8, illustrated is a cross-sectional view of the partially completed integrated circuit 200 illustrated in FIG. 7 after planarizing the blanket layer of plug material 720, thereby forming completed isolation structures 810 and an interconnect structure 820. In the given embodiment, the blanket layer of plug material 720 was subjected to a polysilicon etchback process to form the isolation structures 810 and the interconnect structure 820. Nevertheless, any other known or hereafter discovered process could also be used.

The resulting isolation structures 810 each include sidewall spacers 813 and a plug 818. Similarly, the resulting interconnect structure 820 includes sidewall spacers 823 and a plug 828. It should be noted, however, that the isolation structures 810 and the interconnect structure 820 may also comprise other features neither described nor illustrated.

Figure 9:
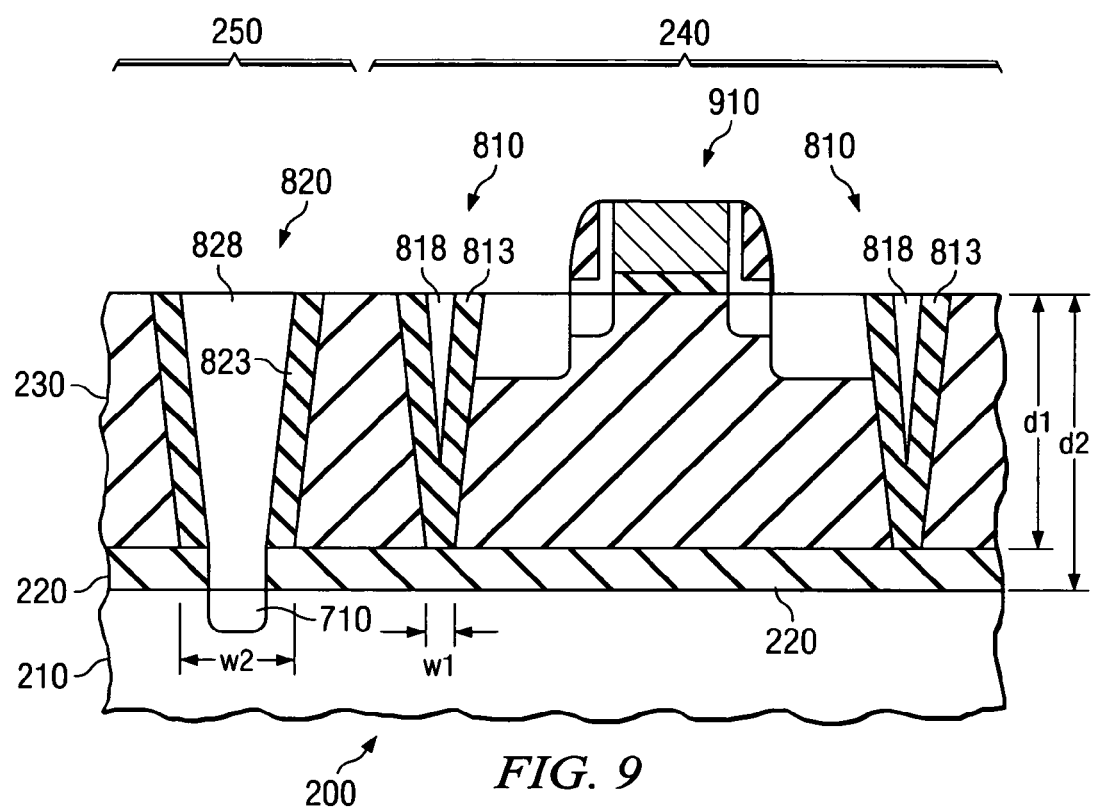
FIG. 9 illustrates a cross-sectional view of the partially completed integrated circuit illustrated in FIG. 8 after forming a conventional transistor device over the semiconductor substrate within the active device region.

Turning now to FIG. 9, illustrated is a cross-sectional view of the partially completed integrated circuit 200 illustrated in FIG. 8 after forming a conventional transistor device 910 over the semiconductor substrate 230 within the active device region 240. As is illustrated, the conventional transistor device 910 is located between the isolation structures 810. As the formation of the transistor device 910 is conventional, no further detail will be given. After completing the transistor device 910, the manufacturing process could continue with forming interlevel dielectric layers and metal levels over the transistor device 910, thus resulting in an operational integrated circuit.

Figure 10:
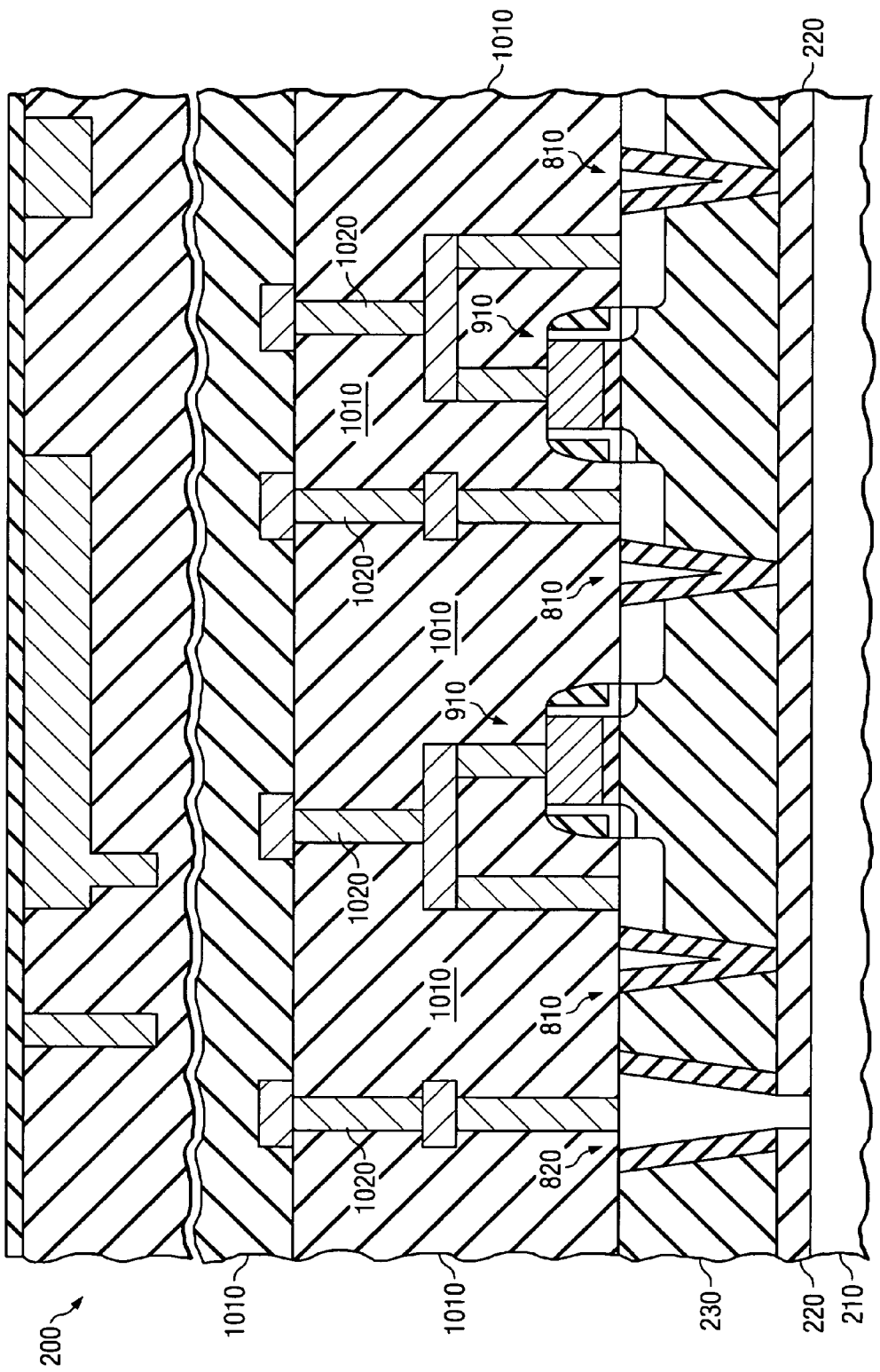
FIG. 10 illustrates a cross-sectional view of a device similar to the partially completed integrated circuit illustrated in FIG. 9 after forming interlevel dielectric layers thereover.

Turning lastly to FIG. 10, illustrated is a cross-sectional view of a device similar to the partially completed integrated circuit 200 illustrated in FIG. 9 after forming interlevel dielectric layers 1010 thereover. As is illustrated, the interlevel dielectric layers 1010 have interconnects 1020 formed therein for contacting the transistor device 910 and the interconnect structure 820. What results in an operational integrated circuit.

Although the present invention has been described in detail, those skilled in the art should understand that they can make various changes, substitutions and alterations herein without departing from the spirit and scope of the invention in its broadest form.

What is claimed is:

1. A method for manufacturing an integrated circuit, comprising:

providing a stack of layers including a wafer substrate, a dielectric layer located over the wafer substrate, and a semiconductor substrate located over the dielectric layer, the semiconductor substrate having one or more transistor devices located therein or thereon;

forming an interconnect that extends entirely through the semiconductor substrate and the dielectric layer, thereby electrically contacting the wafer substrate;

forming one or more isolation structures that extend entirely through the semiconductor substrate to the dielectric layer, wherein forming the interconnect and forming the one or more isolation structures includes forming an interconnect trench and forming one or more isolation trenches in the same step; and forming a layer of polysilicon within the interconnect trench and the one or more isolation trenches, wherein the layer of polysilicon has a thickness ranging from about 500 nm to about 1000 nm.

2. The method as recited in claim 1 wherein forming the interconnect and forming the one or more isolation structures occurs at substantially the same time.

3. The method as recited in claim 1 wherein the interconnect trench has a base width at least about two times a base width of the one or more isolation trenches.

4. The method as recited in claim 1 wherein forming the interconnect includes forming the interconnect having a polysilicon plug.

5. The method as recited in claim 4 wherein forming the interconnect includes forming a doped ohmic contact in the wafer substrate, the polysilicon plug contacting the doped ohmic contact.

6. The method as recited in claim 1 wherein forming the one or more isolation structures includes forming one or more deep trench isolation structures.

7. The method as recited in claim 1 further including forming one or more interlevel dielectric layers over the one or more transistor devices.

8. The method as recited in claim 7 further including forming one or more interconnects within the one or more interlevel dielectric layers for contacting at least one of the one or more transistor devices or the interconnect.

9. A method for manufacturing an integrated circuit, comprising: p1 providing a stack of layers including a wafer substrate, a dielectric layer located over the wafer substrate, and a semiconductor substrate located over the dielectric layer, the semiconductor substrate having one or more transistor devices located therein or thereon;

forming an interconnect that extends entirely through the semiconductor substrate and the dielectric layer, thereby electrically contacting the wafer substrate;

forming one or more isolation structures that extend entirely through the semiconductor substrate to the dielectric layer, wherein forming the interconnect and forming the one or more isolation structures includes forming an interconnect trench and forming one or more isolation trenches in the same step; and forming a layer of polysilicon within the interconnect trench and the one or more isolation trenches, wherein the layer of polysilicon is laminar at the base of the interconnect trench but puddles at the base of the one or more isolation trenches.

10. The method as recited in claim 9 further including subjecting the layer of polysilicon at the base of the interconnect trench and at the base of the one or more isolation trenches to an anisotropic etch.

11. The method as recited in claim 10 wherein the anisotropic etch removes the layer of polysilicon from at least a portion of the base of the interconnect trench thereby exposing the dielectric layer, but leaves the base of the one or more isolation trenches covered.

12. The method as recited in claim 11 further including subjecting the exposed portion of the dielectric layer to an etch, thereby extending the interconnect trench to the wafer substrate.

13. The method as recited in claim 12 further including subjecting an exposed portion of the wafer substrate in the interconnect trench to a dopant, thereby forming a doped ohmic contact in the wafer substrate.

14. The method as recited in claim 13 further including depositing polysilicon in the interconnect trench over the doped ohmic contact and in the one or more isolation trenches over the polysilicon layer in the one or more isolation trenches.

15. A method for manufacturing an integrated circuit, comprising:

providing a stack of layers including a wafer substrate, a dielectric layer located over the wafer substrate, and a semiconductor substrate located over the dielectric layer, the semiconductor substrate having one or more transistor devices located therein or thereon;

forming an interconnect that extends entirely through the semiconductor substrate and the dielectric layer, thereby electrically contacting the wafer substrate; and forming one or more isolation structures that extend entirely through the semiconductor substrate to the dielectric layer, wherein forming the interconnect and forming the one or more isolation structures includes forming an interconnect trench and forming one or more isolation trenches in the same step, and wherein a base of the interconnect has a width at least about two times a width of a base of each of the one or more isolation structures.

* * * * *